US 7,739,559 B2

(12) United States Patent
Suzuki et al.

(10) Patent No.: US 7,739,559 B2
(45) Date of Patent: Jun. 15, 2010

(54) SEMICONDUCTOR DEVICE AND PROGRAM DATA REDUNDANCY METHOD THEREFOR (75) Inventors: Norikatsu Suzuki, Kasugai (JP); Makoto Niimi, Kasugai (JP); Satoru Kawamoto, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/444,251

(22) Filed: May 30, 2006

(65) Prior Publication Data
US 2006/0291305 A1    Dec. 28, 2006

Related U.S. Application Data

(63) Continuation of application No. PCT/JP2005/009882, filed on May 30, 2005.

(51) Int. Cl.
*G11C 29/00* (2006.01)
(52) U.S. Cl. .................................. 714/710; 714/718
(58) Field of Classification Search ................. 714/710, 714/718, 38, 7, 725; 365/200, 201
See application file for complete search history.

(56) References Cited

U.S. PATENT DOCUMENTS

| | | | |
|---|---|---|---|
| 5,303,198 A | 4/1994 | Adachi et al. | |
| 5,343,429 A | 8/1994 | Nakayama et al. | |
| 5,493,531 A | 2/1996 | Pascucci et al. | |
| 5,671,229 A * | 9/1997 | Harari et al. | 714/710 |
| 5,680,363 A | 10/1997 | Dosaka et al. | |
| 5,715,423 A | 2/1998 | Levy | |
| 5,802,551 A | 9/1998 | Komatsu et al. | |
| 5,996,041 A | 11/1999 | Kim | |
| 6,040,997 A | 3/2000 | Estakhri | |
| RE36,732 E | 6/2000 | Miyamoto | |
| 6,643,196 B2 * | 11/2003 | Sugio | 365/200 |
| 6,834,323 B2 * | 12/2004 | Dover et al. | 711/103 |
| 6,865,133 B2 * | 3/2005 | Tsukidate et al. | 365/230.01 |
| 6,937,533 B2 * | 8/2005 | Hojo et al. | 365/200 |

(Continued)

FOREIGN PATENT DOCUMENTS

EP    0477503    4/1992

(Continued)

OTHER PUBLICATIONS

Arimoto, K., at al., A Circuit Design of Intelligent CDRAM with Automatic Write Back Capability. IEEE 1990 Symposium on VLSI Circuits, pp. 79-80, 1990.

(Continued)

*Primary Examiner*—Phung M Chung (57) ABSTRACT

A semiconductor device (1) is provided which includes a regular cell array unit (30), a redundant cell array unit (31) that is provided in relation to the regular cell array unit (30), and a PGM/ER state machine (20) that controls reprogramming in which, when programming of a sector in the regular cell array unit fails (step S3), data involved in the programming that fails and data already stored in the sector in the regular cell array unit are written (step S8) into the redundant cell array unit (31). Since reprogramming is performed to write the data already written in the sector as well as the data involved in the programming that fails into the redundant cell array unit (31), data loss can be prevented and data can be secured, thereby increasing the reliability of the system.

18 Claims, 9 Drawing Sheets

U.S. PATENT DOCUMENTS 7,085,167 B2 * 8/2006 Lee et al. ............... 365/185.22

FOREIGN PATENT DOCUMENTS

| | | |
|---|---|---|
| JP | 2066797 | 3/1990 |
| JP | 04137077 | 5/1992 |
| JP | 5150913 | 6/1993 |
| JP | 07105691 | 4/1995 |
| JP | 8007597 | 1/1996 |
| JP | 2004079602 | 3/2004 |
| JP | 2004342187 | 12/2004 |

OTHER PUBLICATIONS

Dosaka, Katsumi et al., A 100MHz 4Mb Cache DRAM with Fast Copy-Back Scheme, 1992 IEEE International Solid-State Circuits Conference Digest of Technical Papers, pp. 148-149, 1992.

* cited by examiner

SEMICONDUCTOR DEVICE AND PROGRAM DATA REDUNDANCY METHOD THEREFOR

CROSS-REFERENCES TO RELATED APPLICATIONS

This is a continuation of International Application No. PCT/JP2005/009882, filed May 30, 2005 which was not published in English under PCT Article 21(2).

BACKGROUND OF THE INVENTION

1. Field of the Invention

The present invention relates to semiconductor devices, and more particularly, to a technique of replacing a defective memory cell with a redundant memory cell when a defect is caused during data programming.

2. Description of the Related Art

A semiconductor device such as a flash memory has a regular memory cell array and includes a redundant cell array as a backup circuit to be used when a defect is caused in the regular cell array. If an error occurs at the time of data programming or erasing, the defective memory cell is replaced with a redundant memory cell, so as to save data and increase production yield. In Japanese Unexamined Patent Publication No. 8-7597 (hereinafter referred to as Document 1), for example, the row address of a memory cell in which writing has not been properly completed is stored in a defective row address storage circuit. When the defective row address is input, a control circuit performs a control operation to select a redundant memory cell.

In Japanese Unexamined Patent Publication No. 2004-342187 (hereinafter referred to as Document 2), when an error in erasing is detected, relief information that associates the memory block in which the erasing error has occurred with a backup memory block is recorded. If access to a regular memory cell the memory block indicated in the relief information is detected, the access is switched from the regular memory block to the corresponding backup memory block.

Although there has been a conventional automatic redundancy technique by which reprogramming is performed to write data involved in failed programming into a redundant memory cell, a technique of securing data already written in sectors on which programming is to be performed has not been disclosed in the prior art. When an error occurs in a regular sector, a redundant sector is selected instead of the regular sector. Therefore, the already written data cannot be secured unless the data already written in the regular sector is moved to the redundant sector. The technique disclosed in Document 2 is a technique for data erasing, and data protection is not taken into consideration therein.

SUMMARY OF THE INVENTION

It is therefore an object of the present invention to provide a semiconductor device that secures user data and has increased system reliability, and a program data redundancy method therefor.

To achieve the object, a semiconductor device in accordance with the present invention includes a regular cell array region, a redundant cell array region that is provided in relation to the regular cell array region, and a write control unit that controls reprogramming in which, when programming of a sector in the regular cell array region fails, data involved in the programming that fails and data already stored in the sector in the regular cell array region are written into the redundant cell array region. Since reprogramming is performed so as to write the data already written in the sector as well as the data involved in the programming that fails into the redundant cell array region, data loss can be prevented, and data can be secured. Thus, reliability of the memory system can be increased.

A program data redundancy method in accordance with the present invention includes the steps of programming a sector in a regular cell array region of a semiconductor device and performing reprogramming in which, when the programming of the sector in the regular cell array region fails, data involved in the programming that fails and data already stored in the sector in the regular cell array region are written into a redundant cell array region. Thus, likewise the method of reprogramming is performed so as to write the data involved in the programming that fails and the data already written in the sector into the redundant cell array region, thereby preventing data loss and allowing data to be secured. Therefore, the reliability of a system utilizing this programming method in accordance with the present invention can be increased.

DESCRIPTION OF THE PREFERRED EMBODIMENTS

A description will now be provided, with reference to the accompanying drawings, of embodiments of the present invention.

First Embodiment

Figure 1:
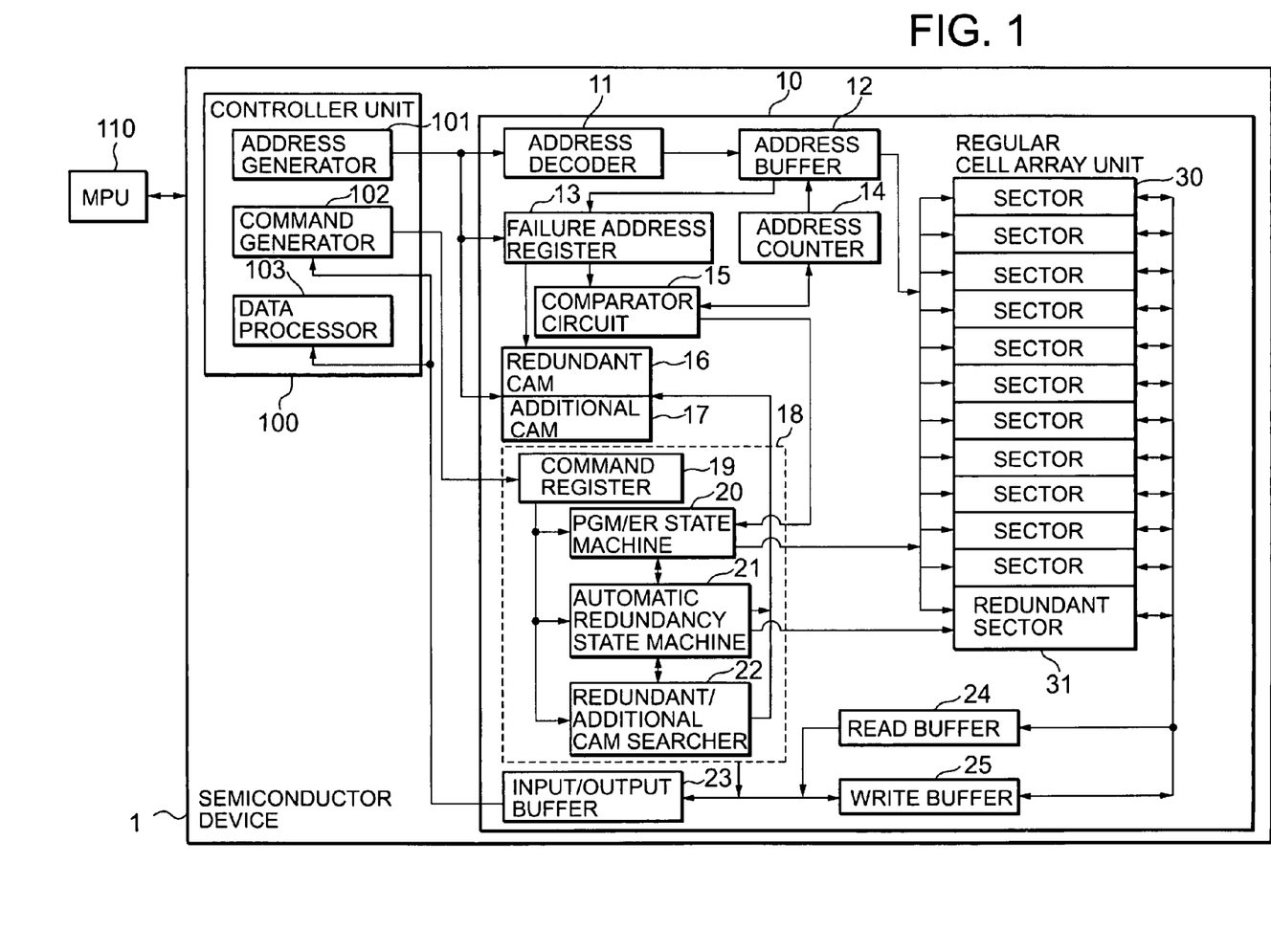
FIG. 1 is a block diagram of the structure of a semiconductor device in accordance with a first embodiment of the present invention.

Referring first to FIG. 1, a structure of a semiconductor device in accordance with a first embodiment of the present invention is described. As shown in FIG. 1, a semiconductor device 1 in accordance with the first embodiment includes a memory unit 10 and a controller unit 100 that controls the memory unit 10. A Micro Processing Unit (MPU) 110 that controls the semiconductor device 1 is connected to the semiconductor device 1 from outside.

The controller unit 100 includes an address generator 101, a command generator 102, and a data processor 103, as shown in FIG. 1. The address generator 101 generates addresses of a cell array unit in which data is to be written or erased. The command generator 102 analyzes instructions input from the external MPU 110 and generates commands such as programming commands and erasing commands. Each generated command is output to a command register 19 of the memory unit 10. The data processor 103 processes data to be written into the memory unit 10 and data read from the memory unit 10.

The memory unit 10 includes an address decoder 11, an address buffer 12, a failure address register 13, an address counter 14, a comparator circuit 15, a redundant Contents Addressable Memory (CAM) 16, an additional CAM 17, a control circuit 18, an input/output buffer 23, a read buffer 24, a write buffer 25, a regular cell array unit 30, and a redundant cell array unit 31. The regular cell array unit 30 includes sectors, and the redundant cell array unit 31 normally includes a smaller arbitrary number of sectors than the number of sectors of the regular cell array unit 30.

The control circuit 18 includes a command register 19, a write control unit 20, such as a program/erase state machine (hereinafter referred to as the PGM/ER state machine) 20, an automatic redundancy state machine 21, and a search control unit 22 such as a redundant/additional CAM searcher 22.

The address decoder 11 decodes each address signal generated by the address generator 101 and outputs a select signal for selecting the corresponding memory cell. The address buffer 12 temporarily accumulates address signals decoded by the address decoder 11 and supplies the addresses to a column decoder 56 and a row decoder 52 (FIG. 2) of the regular cell array unit 30 and the redundant cell array unit 31.

The address counter 14 generates addresses of the regular cell array unit 30 and outputs the addresses to the comparator circuit 15 at the time of automatic redundancy. Also, as a MATCH signal (described later) is output from the comparator circuit 15 at the time of automatic redundancy, the address counter 14 outputs an output disabling signal for each address indicated by the comparator circuit 15 to the address buffer 12. Upon receipt of an output disabling signal, the address buffer 12 does not output the corresponding address.

When programming in the regular cell array unit 30 fails, the address (a column address, a row address, a sector number, or the like) at which the programming fails is stored in the failure address register 13.

The comparator circuit 15 compares the address generated by the address counter 14 with the address stored in the failure address register 13. If the two addresses match each other, the comparator circuit 15 outputs a MATCH signal to the address counter 14. If the two addresses do not match each other, the comparator circuit 15 outputs a NOMATCH signal to the PGM/ER state machine 20. The PGM/ER state machine 20, in response to receiving a NOMATCH signal from the comparator circuit 15, reads the data at the corresponding address from the regular cell array unit 30, and writes the read data into the redundant cell array unit 31.

The command register 19 of the control circuit 18 recognizes programming commands and erasing commands issued from the controller unit 100, and, in response thereto, controls the PGM/ER state machine 20. The command register 19 also recognizes automatic memory redundant commands (including enable/disable confirmation commands) issued from the controller unit 100 and, in response thereto, controls the automatic redundancy state machine 21 or the redundant/additional CAM searcher 22. The command register 19 further recognizes polling commands issued from the controller unit 100, and controls the PGM/ER state machine 20 and the automatic redundancy state machine 21 or the redundant/additional CAM searcher 22.

The PGM/ER state machine 20 performs programming and erasing on the regular cell array unit 30 and also performs verification in conjunction with those operations. The PGM/ER state machine 20 further performs programming and erasing in the redundant cell array unit 31 and, likewise, performs verification in conjunction with those operations. The PGM/ER state machine 20 also outputs responses to various polling commands issued from the controller unit 100.

The automatic redundancy state machine 21 performs various control operations at the time of automatic redundancy. Using the redundant/additional CAM searcher 22, the automatic redundancy state machine 21 determines through searching whether there is an enabled region in the redundant cell array unit 31. The automatic redundancy state machine 21 also outputs a programming or erasing request signal to the PGM/ER state machine 20 at the time of automatic redundancy. In addition, the automatic redundancy state machine 21 switches the access destination to the redundant CAM 16 and the additional CAM 17 at the time of automatic redundancy so as to write information into the redundant CAM 16 and/or the additional CAM 17.

The redundant CAM 16 (the second memory part) manages information as to the relationship between each sector number in the regular cell array unit 30 at which programming fails and each sector number in the redundant cell array unit 31 at which programming fails. The additional CAM 17 (the first memory part) stores information as to whether the sectors of the redundant cell array unit 31 are being used or not being used, information as to whether erasing has already been performed on those redundant sectors, and information indicating that automatic redundancy has been performed on those redundant sectors after product shipment. The redundant CAM 16 and the additional CAM 17 will later be described in greater detail.

Figure 2:
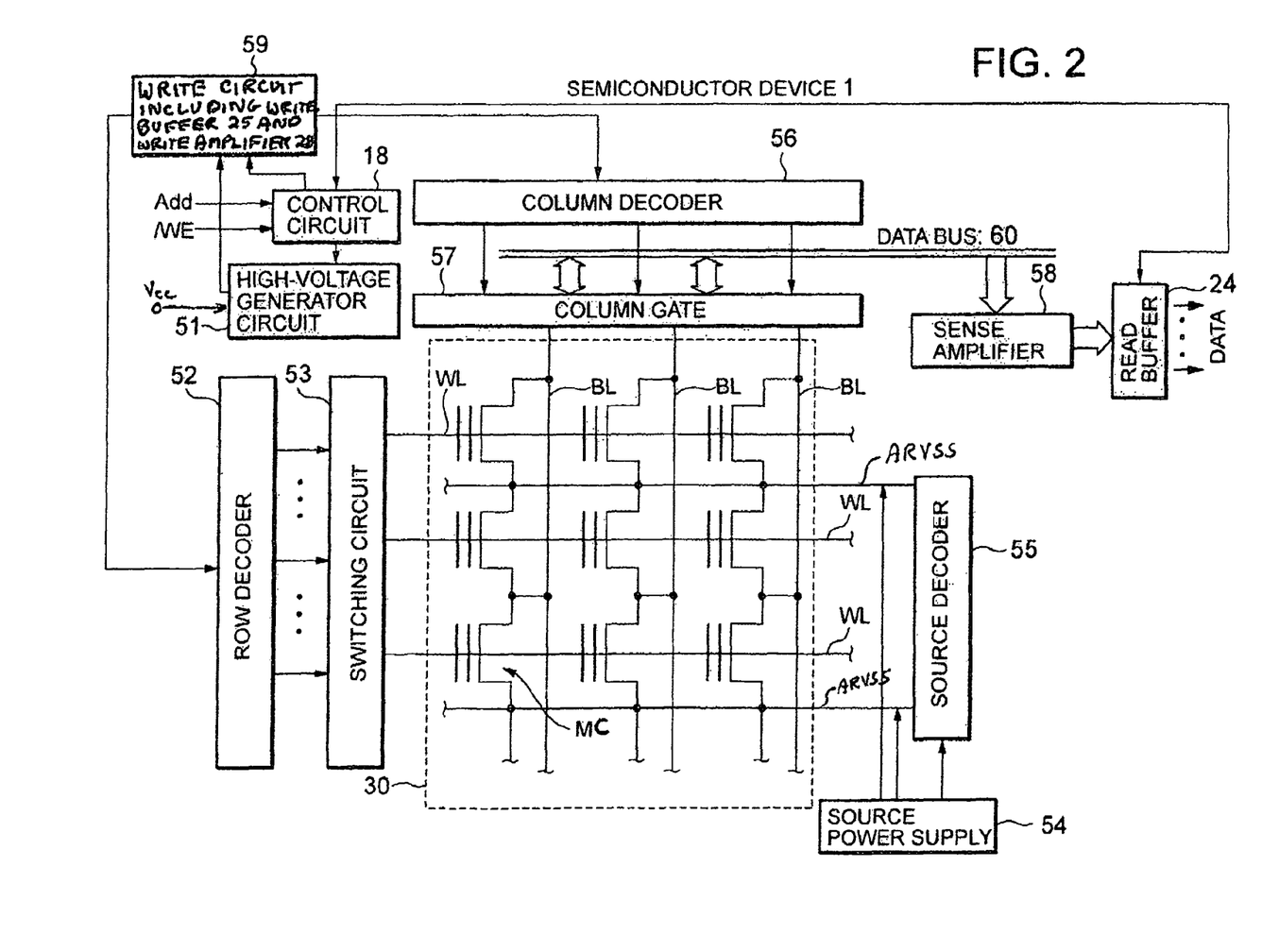
FIG. 2 illustrates the structure of the cell array unit and its peripheral parts in accordance with the first embodiment of the present invention.

Referring now to FIG. 2, the structure of the cell array units 30 and 31, and the functions provided around the cell array units 30 and 31 are described.

The regular cell array unit 30 and the redundant cell array unit 31 include non-volatile memory cells MC each having a control gate connected to a word line WL, a drain connected to a bit line BL, a source connected to a source line ARVSS, and a floating gate made of polycrystalline silicon as a charge accumulating layer. Those memory cells MC are arranged in a matrix fashion.

The control circuit 18 receives a control signal such as a write enable signal (/WE), an address signal or a data signal from the outside. Based on those control signals, the control circuit 18 functions as a state machine that controls various internal circuits to perform operations such as writing, erasing, and reading of the memory cells MC. As shown in FIG. 1, the control circuit 18 includes the command register 19, the PGM/ER state machine 20, the automatic redundancy state machine 21, and the redundant/additional CAM searcher 22.

A high-voltage generator circuit 51 adjusts a source voltage Vcc to a predetermined level so as to generate a bit-line voltage and a word-line voltage to be supplied to a write circuit 59. A row decoder 52 decodes each address supplied from the address buffer 12. A switching circuit 53 activates the word line WL of a memory cell MC in accordance with the decoding results. A source decoder 55 is supplied with power from a source power supply 54, and selects a source line ARVSS. A column decoder 56 decodes each address supplied from the address buffer 12 (FIG. 1).

Based on a decoded address signal, a column gate 57 selectively connects a bit line BL of the regular cell array unit 30 to a sense amplifier 58 at the time of reading. The column gate 57 selectively connects a bit line BL to a write amplifier 28 in the write circuit 59 at the time of writing. With this structure, the data reading/writing paths to the memory cells MC of the cell array units 30 and 31 are established.

The sense amplifier 58 compares the data in a memory cell MC with the data in a reference cell, so as to determine whether the data in the memory cell is "0" or "1". The sense amplifier 58 then supplies the comparison result as the read data to the read buffer 24.

The write circuit 59 drives the row decoder 52 and the column decoder 56 under the control of the control circuit 18, so as to perform a data writing operation for a desired memory cell MC.

A verifying operation accompanying a programming operation and an erasing operation is performed by comparing the current of data supplied from a memory cell MC designated by the row decoder 52 and the column decoder 56 with the reference current represented by a programming verification reference cell and an erasing verification reference cell.

Data that is input from the outside is temporarily stored in the write buffer 25, and the write amplifier 28 writes the data onto a bit line BL selected by the column decoder 56. Thus, the data is written into a selected memory cell MC.

Figure 3:
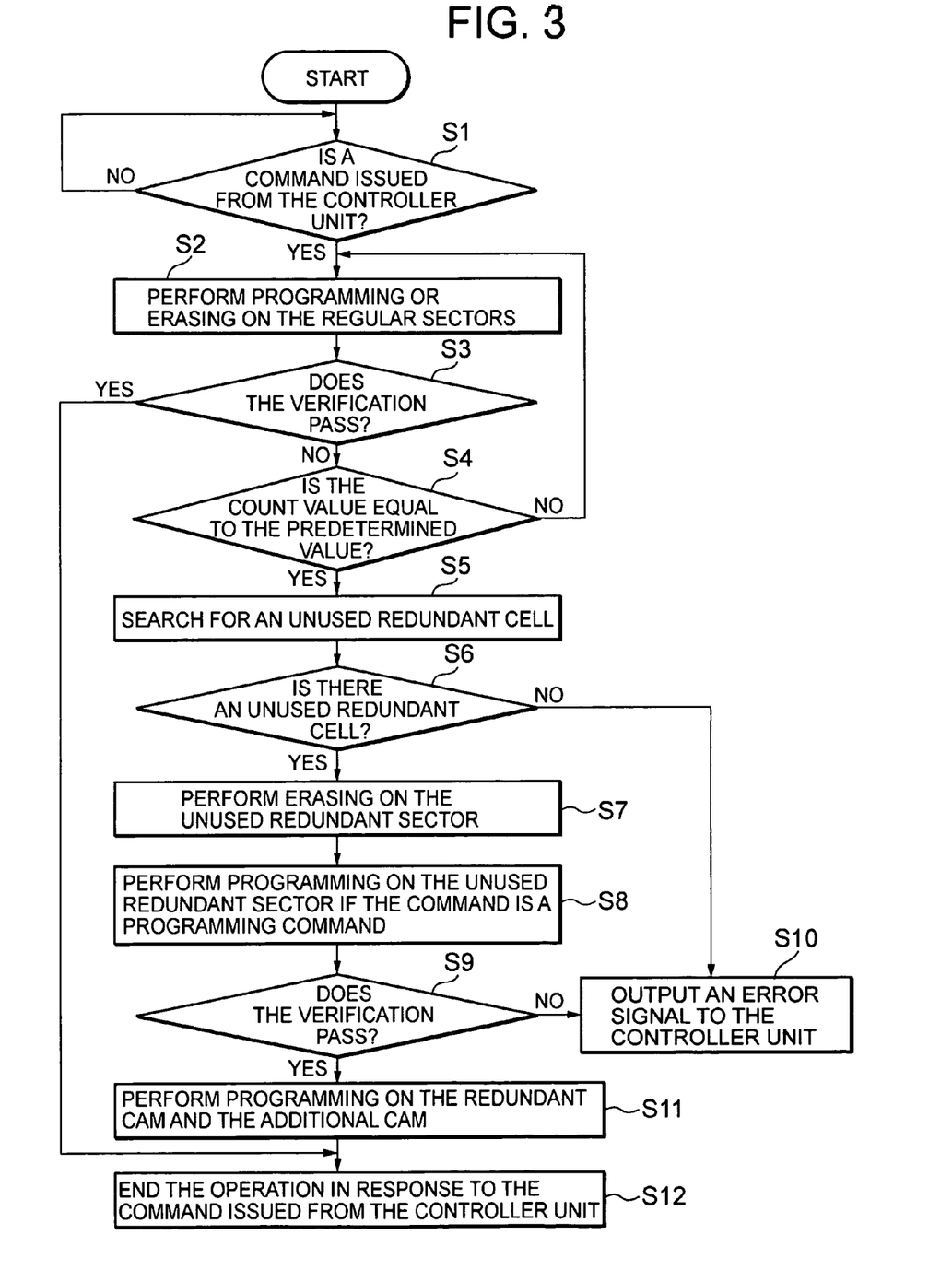
FIG. 3 is a flowchart of the operation of the semiconductor device in accordance with the first embodiment of the present invention.

***Referring now to the flowchart shown in FIG. 3, operation in accordance with the first embodiment of the present invention is described. When a programming or erasing command is issued from the controller unit 100 ("YES" in step S1), the PGM/ER state machine 20 performs programming or erasing on a sector of the regular cell array unit 30 in accordance with the issued command (step S2).

Verification is then performed to determine whether the programming or erasing has been properly performed (step S3). If the programming or erasing is determined to have been properly performed ("YES" in step S3), the verification passes, and operation in response to the command issued from the controller unit 100 comes to an end (step S12).

If the programming or erasing is determined not to have been properly completed ("NO" in step S3), it is deteremined whether the counter value has reached a predetermined value (step S4). If the counter value is not the predetermined value ("NO" in step S4), programming or erasing on a sector of the regular cell array unit 30 and verification of the programming or erasing are repeated (steps S2 and S3). When the counter value reaches the predetermined value ("YES" in step S4), a timeout condition is detected, and the PGM/ER state machine 20 outputs a programming or erasing aid request signal to the automatic redundancy state machine 21. Although time is measured for detecting a timeout condition by way of the count value of a counter in accordance with this embodiment, a timer or the like may also be employed to measure time.

Receiving a programming or erasing aid request signal from the PGM/ER state machine 20, the automatic redundancy state machine 21 searches the redundant CAM 16 and the additional CAM 17 for an unused redundant sector that can be used for data recovery (step S5). If there is not an unused redundant sector ("NO" in step S6), the automatic redundancy state machine 21 outputs an error signal to the controller unit 100 (step S10). It there is an unused redundant sector ("YES" in step S6), the automatic redundancy state machine 21 outputs a redundant sector erasing request signal to the PGM/ER state machine 20. In accordance with the erasing request signal, the PGM/ER state machine 20 performs erasing on the redundant sector (step S7).

In a case where a programming command is issued from the controller unit 100 when the erasing on the redundant sector is completed, the PGM/ER state machine 20 reads the data to be written into the redundant sector of the failed data and the data written into the corresponding regular sector, and writes all of that data into the redundant sector (step S8). Verification of this programming is then performed. If the verification passes ("YES" in step S9), the PGM/ER state machine 20 outputs a programming or erasing completion signal to the automatic redundancy state machine 21. If the verification does not pass ("NO" in step S9), the PGM/ER state machine 20 outputs an error signal to the controller unit 100 (step S10). Receiving the programming or erasing completion signal, the automatic redundancy state machine 21 writes the automatic redundancy information into the redundant CAM 16 and the additional CAM 17 (step S11) and operation in response to the command issued from the controller unit 100 comes to an end (step S12).

Figure 4:
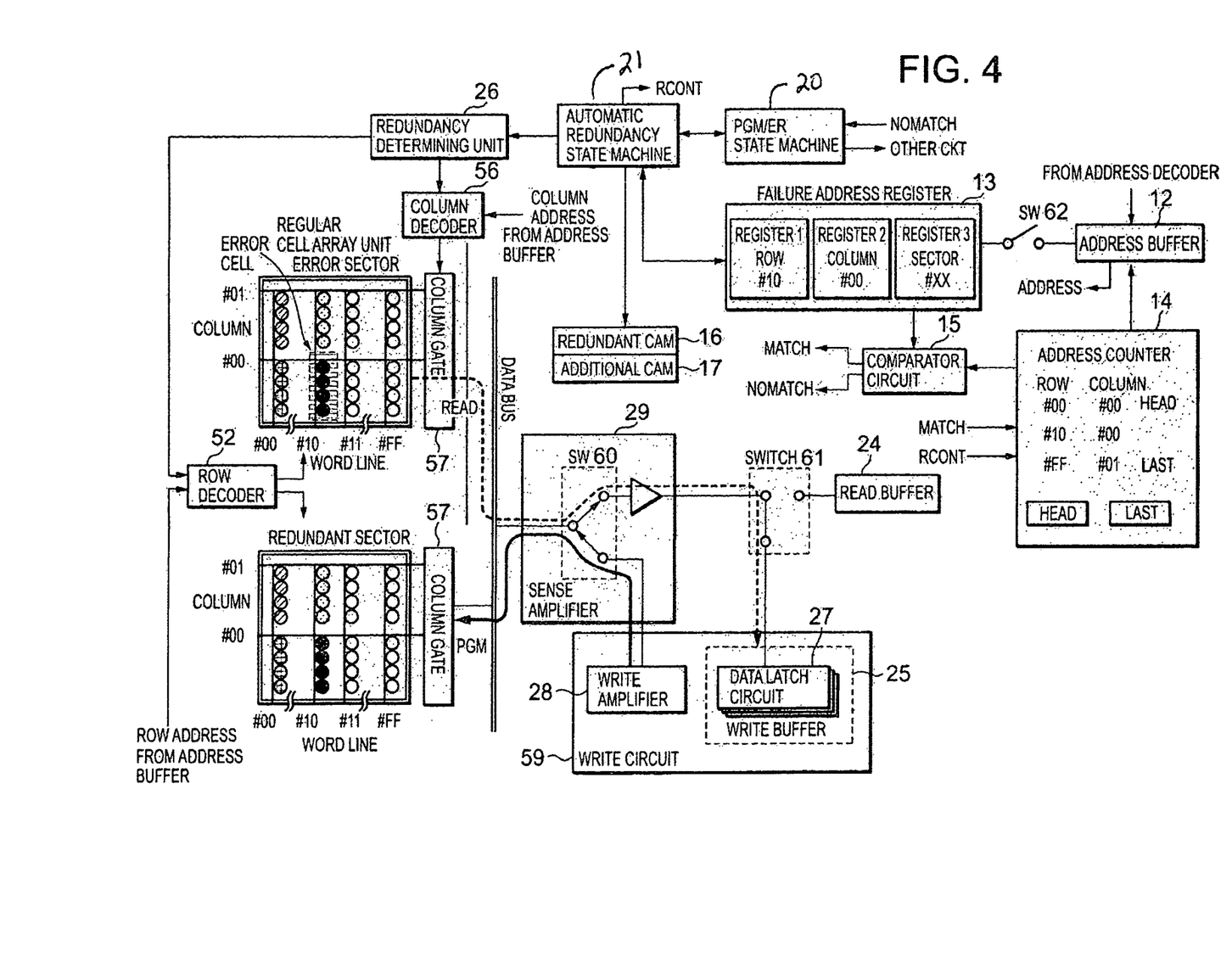
FIG. 4 illustrates the operation of the semiconductor device in accordance with the first embodiment of the present invention.
Figure 5A:
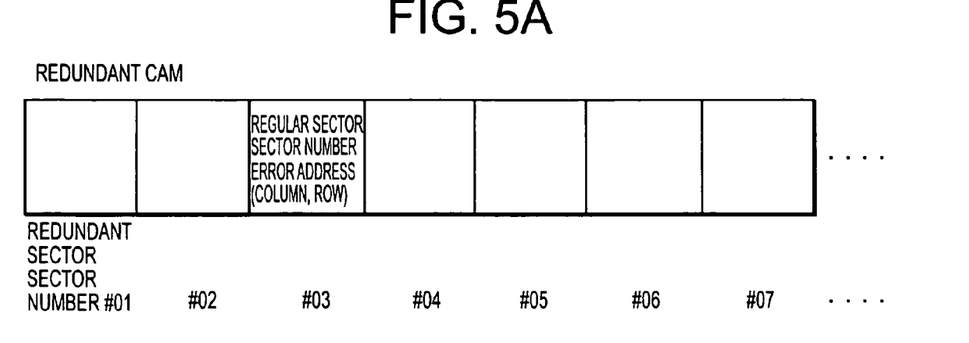
FIG. 5A illustrates the structure of the redundant CAM in accordance with the first embodiment of the present invention.
Figure 5B:
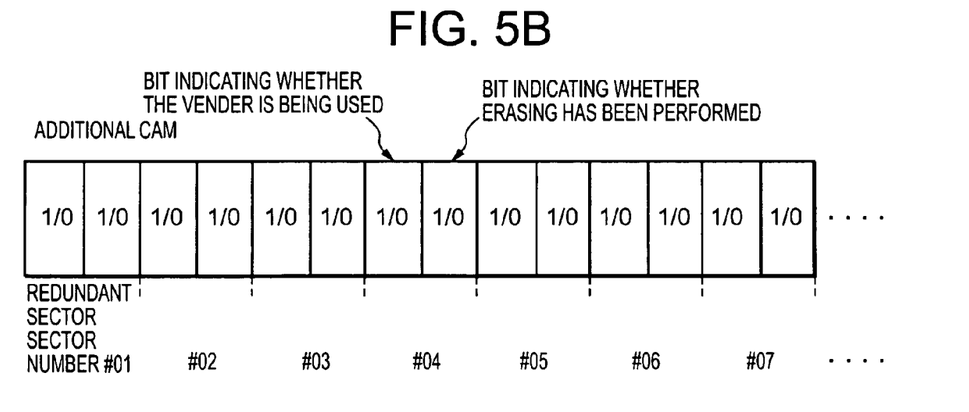
FIG. 5B illustrates the structure of the additional CAM in accordance with the first embodiment of the present invention.

***Referring now to FIG. 4 and FIGS. 5A and 5B, the above-described operations are described in greater detail. First, the operation to be performed in the case where the automatic redundancy state machine 21 receives a programming or erasing aid request signal from the PGM/ER state machine 20 is described. Upon receipt of an aid request signal, the automatic redundancy state machine 21 searches the redundant CAM 16 illustrated in FIG. 5A and the additional CAM 17 illustrated in FIG. 5B for an unused redundant sector, the search of the redundant CAM 16 and the additional CAM 17 being carried out by the redundant/additional CAM searcher 22.

As shown in FIG. 5A, the sector number and the error address of a regular sector to be determined to be defective are managed in each redundant sector in the redundant CAM 16. For example, in redundant sector #03 in FIG. 5A, the sector number of a regular sector having an error and the address of the memory cell in which an error is caused are recorded. In the additional CAM illustrated in FIG. 5B, information as to whether the redundant sector was used by a vender prior to product shipment, information as to whether the redundant sector has been initialized (erasing has been performed), and information as to whether the redundant sector has been used as a redundant region for the aid in recovery from a program error after product shipment are recorded. Referring to the information, the automatic redundancy state machine 21 detects a redundant sector in an unused state to determine whether initialization has been performed. The information as to whether the redundant sector has been used as a redundant region for the aid in recovery from a program error after product shipment is of the same structure as the information as to whether the redundant sector was used by a vender prior to product shipment. The redundant CAM 16 (the second memory part) might contain flag information indicating whether the error address of each sector number is valid. In such a case, the flag information can be replaced with the information indicating whether the redundant sector has been used by a vender prior to product shipment in the additional CAM 17 (the first memory part) during the searching operation.

When detecting an unused redundant sector, the automatic redundancy state machine 21 refers to the additional CAM 17 illustrated in FIG. 5B to determine whether erasing has been performed on the redundant sector. If erasing was performed prior to product shipment, it is not necessary to perform the erasing of step S7 and therefore, the automatic redundancy state machine 21 referring to the information recorded in the additional CAM 17 to determine whether erasing to be performed can, depending on the information stored therein, advantageously bypass step S7.

Next, the programming or erasing and verifying operations for an unused redundant sector in step S8 are described in detail. When detecting an unused redundant sector, the automatic redundancy state machine 21 writes the address whereat programming failed into the failure address register 13. The failure address register 13 includes three registers, as shown in FIG. 4, so that the row address and column address of the memory cell in which programming failed, and the sector number of the redundant sector containing the memory cell in which the programming failed can be written into the three registers.

The automatic redundancy state machine 21 then outputs a redundant sector programming request signal to the PGM/ER state machine 20. In response to the request, the PGM/ER state machine 20 writes data into the redundant sectors after programming has failed. The data to be written into the redundant sectors is stored in a data latch circuit 27 in the write buffer 25 and, then, a switch 60 in a sense amplifier 29 is switched so as to write the data from the data latch circuit 27 into the redundant sectors.

The PGM/ER state machine 20 then moves the data already written in the sectors of the regular cell array unit 30, including the memory cell in which programming has failed, to the redundant sectors.

Figure 6:
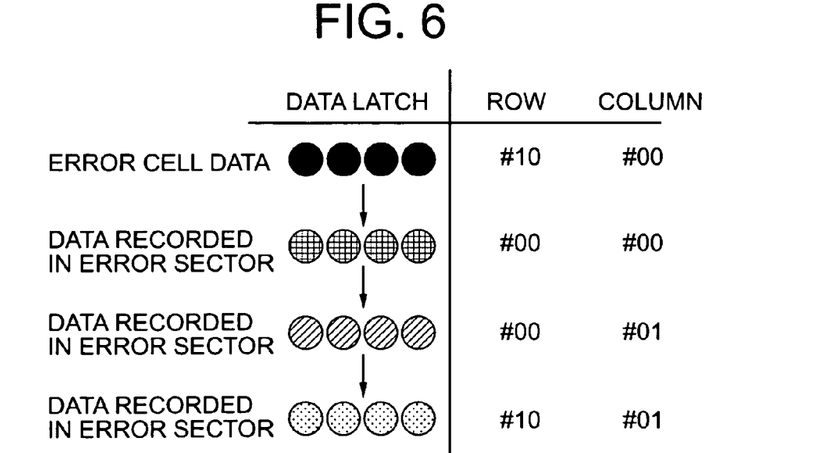
FIG. 6 shows data to be latched in the data latch circuit, and the row and column addresses in accordance with the first embodiment of the present invention.
Figure 7:
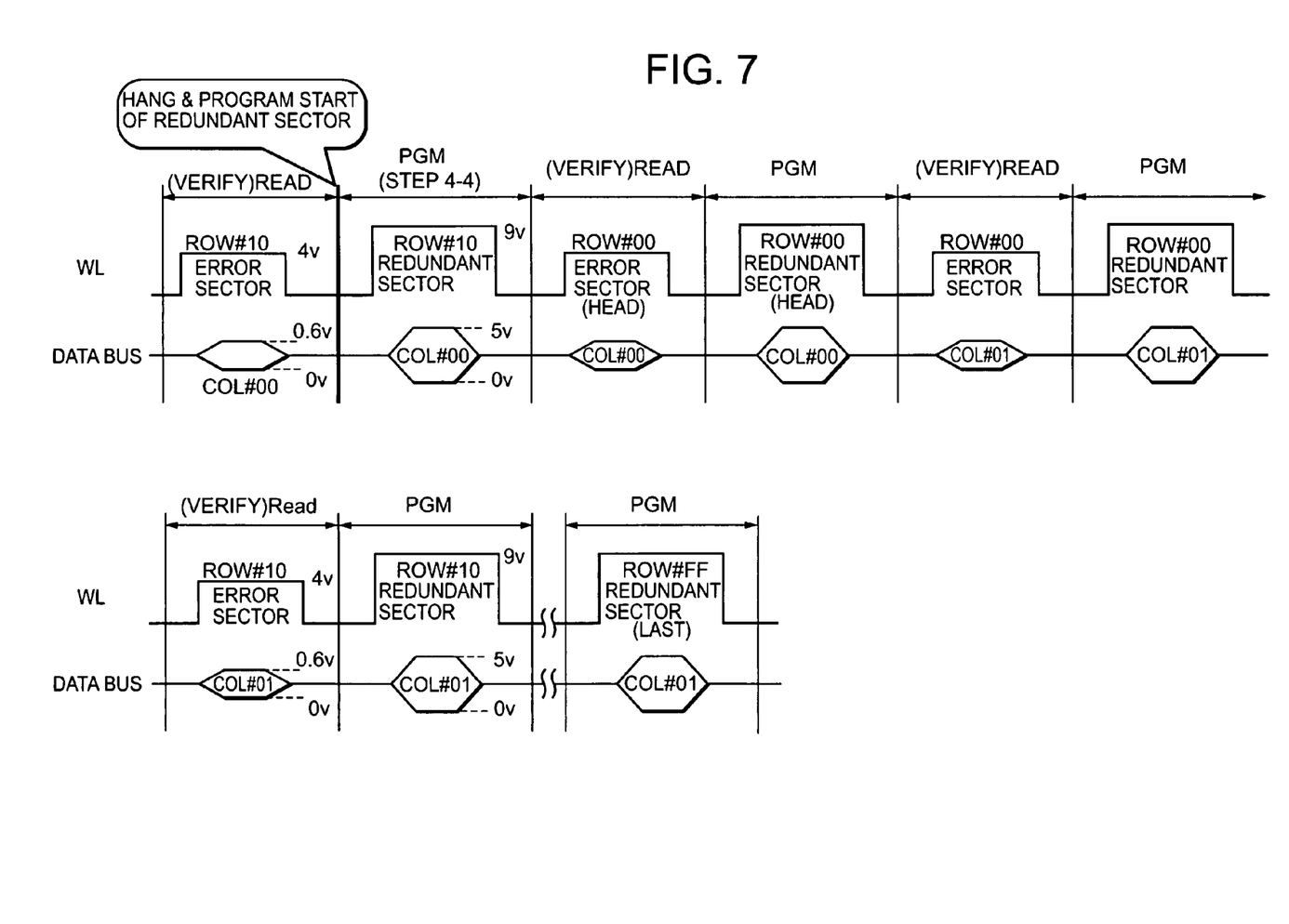
FIG. 7 shows procedures for accessing regular sectors and redundant sectors at the time of automatic redundancy in accordance with the first embodiment of the present invention.

First, the comparator circuit 15 compares the failed address stored in the failure address register 13 with the address in the sectors generated by the address counter 14. The address counter 14 sequentially generates the addresses in sectors in which an error is caused. If the address generated by the address counter 14 does not match the failure address, the comparator circuit 15 outputs a NOMATCH signal to the PGM/ER state machine 20. The PGM/ER state machine 20, in response to receiving the NOMATCH signal, reads the data of the corresponding address from the regular cell array unit 30, and writes the read data into the data latch circuit 27. Switch 60 in the sense amplifier 29 and a switch 61, as shown in FIG. 4, are controlled by the PGM/ER state machine 20 so as to write the data into the data latch circuit 27. The data written in the data latch circuit 27 is then output through the write amplifier 28 of the write circuit 59, and written into the redundant sectors. This procedure is repeated to move the data from the sector in which an error was caused into the redundant sectors. FIG. 6 shows the order of data to be written into the data latch circuit 27, and the column addresses and the row addresses of the data. FIG. 7 shows the access to sectors in which an error has occurred and redundant sectors, reading of data from the sector with errors, and writing of data into the redundant sectors.

When the address generated by the address counter 14 matches the failure address, the comparator circuit 15 outputs a MATCH signal to the address counter 14, as shown in FIG. 4. The address counter 14, in response thereto, outputs an output disabling signal for the address identified by the comparator circuit 15 to the address buffer 12. The address buffer 12, in response to receiving the output disabling signal, does not output the corresponding address. Since the data to be written into the memory cell in which an error has occurred is stored in the data latch circuit 27, reading of data from the error sector is not performed.

Next, the programming to be performed on the redundant CAM 16 and the additional CAM 17 in step S11 is described in greater detail. After receiving a programming/erasing completion signal indicating the completion of the programming in the redundant sectors from the PGM/ER state machine 20, the automatic redundancy state machine 21 writes automatic redundancy information in the redundant CAM 16 and the additional CAM 17. For example, in a case where the redundant sector #03 shown in FIG. 5A is used for automatic redundancy, the sector number of the regular sector in which an error has occurred and the column and row addresses of the memory cell in which an error has occurred are written into the redundant sector. If the address designated from the outside indicates a sector in which an error has occurred, the PGM/ER state machine 20 refers to the redundant CAM 16 and performs processing on the corresponding redundant sector. In this manner, even if the controller unit 100 does not recognize the address of the redundant sector, the address can be converted inside the controller unit 100 so as to access the redundant sector. Meanwhile, the occurrence of a recovery from program error after product shipment is recorded in the CAM corresponding to the redundant sector #03 of the additional CAM 17 as shown in FIG. 5B.

Figure 8:
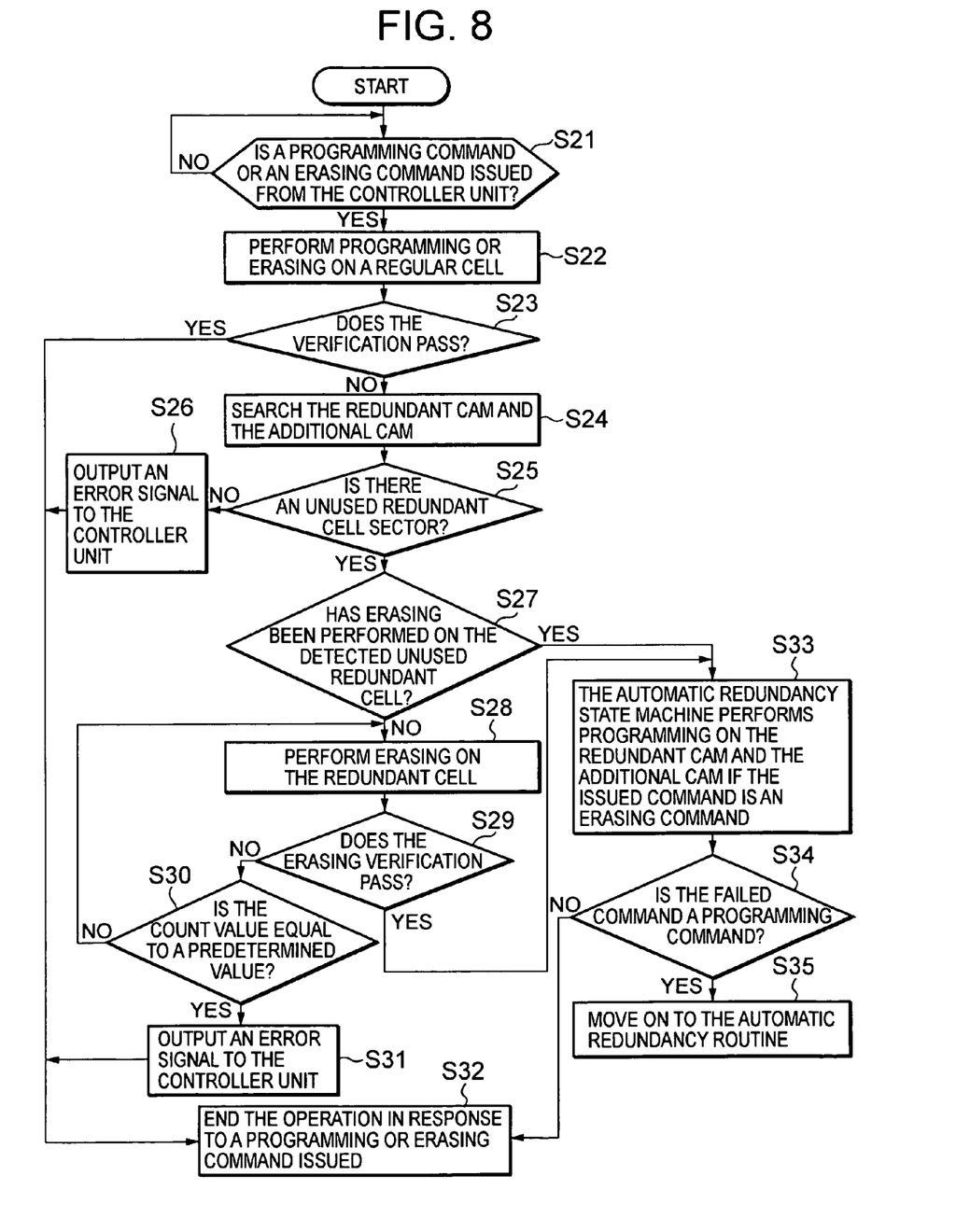
FIG. 8 is a flowchart of a part of the operation of the semiconductor device in accordance with the first embodiment of the present invention.
Figure 9:
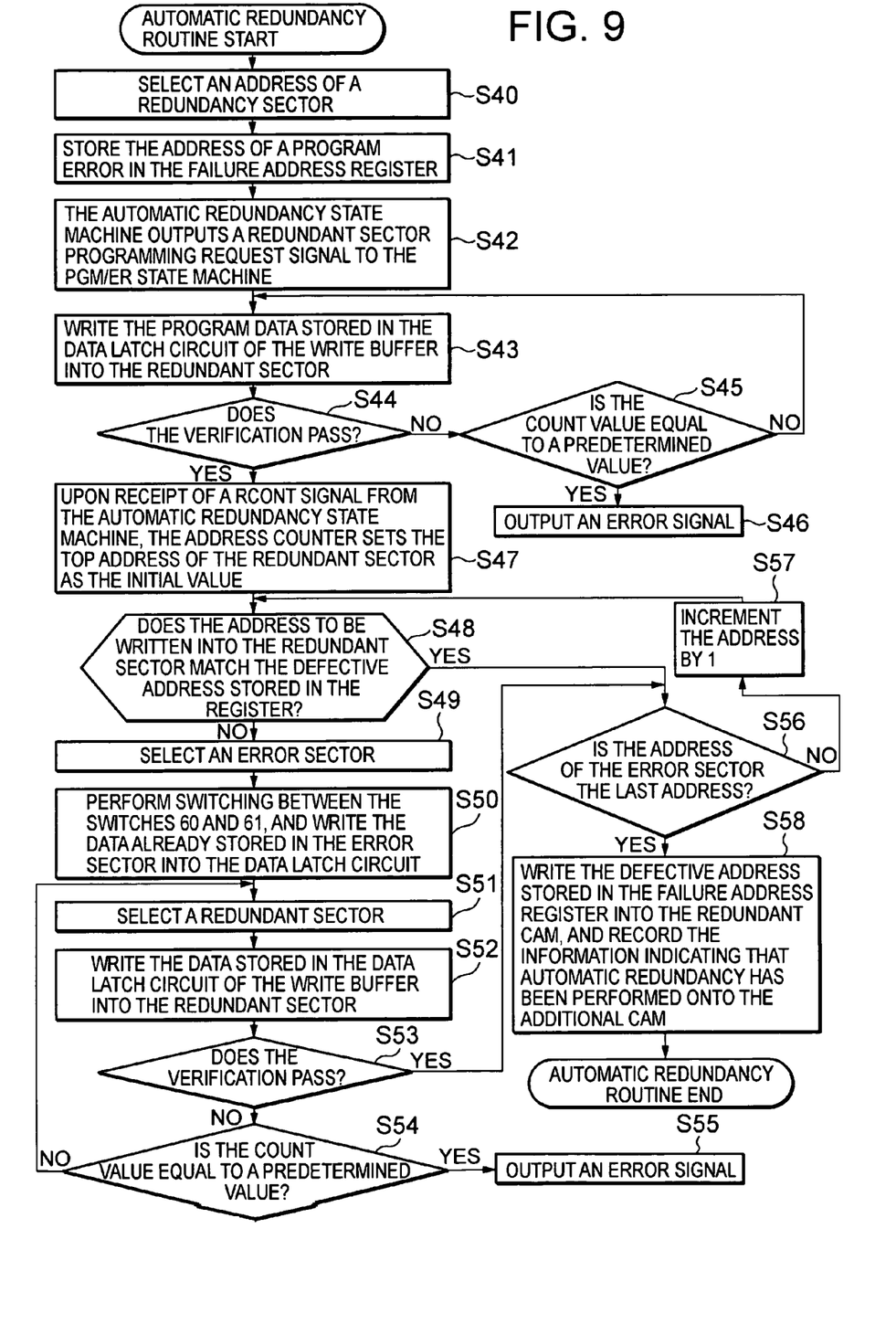
FIG. 9 is a flowchart of the rest of the operation of the semiconductor device in accordance with the first embodiment of the present invention.

Referring now to the flowcharts of FIGS. 8 and 9, procedures during operation in accordance with this first embodiment of the present invention are described in greater detail.

When a program or erase command is provided from the controller unit 100 ("YES" in step S21), the PGM/ER state machine 20 performs programming or erasing on the sectors of the regular cell array unit 30 in accordance with the provided command (step S22).

Verification is then performed to determine whether the programming or erasing has been properly performed. If the programming or erasing is determined to have been properly performed ("YES" in step S23), the verification passes, and the operation in response to the command provided from the controller unit 100 comes to an end (step S32). If the programming or erasing is determined, through verification, not to have been properly performed ("NO" in step S23), the PGM/ER state machine 20 outputs a programming/erasing aid request signal to the automatic redundancy state machine 21.

Upon receipt of the programming/erasing aid request signal, the automatic redundancy state machine 21 searches the redundant CAM 16 and the additional CAM 17 with the redundant/additional CAM searcher 22 (step S24), so as to determine whether there is an unused redundant sector (step S25). If there is not an unused redundant sector ("NO" in step S25), the automatic redundancy state machine 21 outputs an error signal to the controller unit 100 (step S26). If an unused redundant cell is detected ("YES" in step S25), the automatic redundancy state machine 21 determines whether erasing has already been performed on the redundant cell (step S27). At the time of product shipment, information as to whether erasing has been performed on the redundant sector is recorded in the additional CAM 17. The automatic redundancy state machine 21 refers to this information to determine whether erasing has already been performed (step S27). The determination in step S27 should preferably be carried out on the basis of information regarding whether the redundant sector has been used by a vender at the time of product shipment and information regarding whether the redundant sector has been used as a redundant region for aid in recovery from a program error after product shipment in the additional CAM, as shown in FIG. 5B, because further redundancy is not preferable, in terms of product reliability, for sectors wherein redundancy has already been performed by a vender and/or sectors wherein automatic redundancy has already been performed.

If erasing is determined not to have been performed on the redundant cell ("NO" in step S27), the automatic redundancy state machine 21 outputs an erasing-verification request signal for the redundant sector to the PGM/ER state machine 20. Upon receipt of the erasing-verification request signal, the PGM/ER state machine 20 performs erasing on the redundant sector (step S28) and verification (step S29). If the erasing is determined, through verification, not to have been properly performed ("NO" in step S29), it is determined whether the count value of the counter has reached a predetermined value (step S30). When the count value has not reached the predetermined value ("NO" in step S30), the erasing procedure in step S28 and the verification procedure in step S29 are repeated. When the count value of the counter has reached the predetermined value ("YES" in step S30), a count-up condition is detected and the PGM/ER state machine 20 outputs an error signal to the controller unit 100 (step S31). Additional search of the given number of redundant sectors may be added to the control procedure of step S31. If one of the unused redundant sectors is in an excellent state, the operation can move on to the next step, thus increasing the efficiency of recovery of the semiconductor device.

If erasing is determined through the verifying procedure in step S29 to have been properly completed ("YES" in step S29), or if erasing is determined in step S27 to have already been performed ("YES" in step S27), the automatic redundancy state machine 21 performs programming on the redundant CAM 16 and the additional CAM 17 (step S33). However, the procedure of step S33 is carried out only in a case where an erasing command has been provided from the controller unit 100. Here, the information associating the sectors in which an error has occurred in the regular cell array unit 30 with the redundant sectors is recorded in the redundant CAM 16. The programming of the redundant CAM 16 and the additional CAM 17 when a programming command is provided from the controller unit 100 is performed in step S58 (FIG. 9) described later.

The automatic redundancy state machine 21 then determines whether the failed command is a programming command (step S34). If the failed command is an erasing command ("NO" in step S34), the operation performed in response to the command issued from the controller unit 100 comes to an end (step S32). If the failed command is a programming command ("YES" in step S34), the operation moves on to an automatic redundancy routine shown in FIG. 9.

Referring now to the flowchart shown in FIG. 9, the automatic redundancy routine is described in detail. In the automatic redundancy routine, a programming start signal is provided from the automatic redundancy state machine 21. This programming start signal is supplied to the redundancy determining unit 26 shown in FIG. 4. Upon receipt of the programming start signal, the redundancy determining unit 26 switches the row decoder 52 and the column decoder 56 to the redundant sector side (step S40). The redundancy determining unit 26 also closes a switch 62 shown in FIG. 4, thereby storing the address of the program error in the failure address register 13 (step S41). As shown in FIG. 4, the row address, the column address, and the sector number at which programming has failed can be recorded in the failure address register 13.

The automatic redundancy state machine 21 then outputs a redundant sector programming request signal to the PGM/ER state machine 20 (step S42). Upon receipt of the programming request signal, the PGM/ER state machine 20 writes the data accumulated in the data latch circuit 27 of the write buffer 25 into the redundant sector (step S43). Verification of the data thus written is then performed (step S44). If writing of the data is determined, through verification, not to have been properly performed ("NO" in step S44), the count value of a counter is compared with a predetermined value. In a case where the count value has not reached the predetermined value ("NO" in step S45), the writing of data into the redundant sector (step S43) and the verification of the writing are repeated for a predetermined period of time. In a case where the count value has reached the predetermined value ("YES" in step S45), the PGM/ER state machine 20 outputs an error signal to the controller unit 100 (step S46).

If writing of the data into the redundant sector is determined, through verification, to have been properly performed ("YES" in step S44), procedures for moving the data already written in the sectors of the regular cell array unit 30 in which an error has occurred to the redundant sector are carried out. First, the address counter 14 sets the top address of the redundant sector as the initial value in accordance with a RCONT signal that is output from the automatic redundancy state machine 21 (step S47). The comparator circuit 15 then compares the address generated from the address counter 14 with the address recorded in the failure address register 13. If the address generated from the address counter 14 does not match the address recorded in the failure address register 13 ("NO" in step S48), the PGM/ER state machine 20 selects the sector in which an error has occurred (step S49). The PGM/ER state machine 20 controls the switches 60 and 61 so as to write the data already written in the sector with the error into the data latch circuit 27 (step S50). The PGM/ER state machine 20 then selects a redundant sector (step S51) and writes the data accumulated in the data latch circuit 27 into the redundant sector (step S52). After the data is written therein, verification is performed (step S53). If the writing of the data is determined, through verification, to have been properly performed ("YES" in step S53), it is determined whether the address in the sector with the error is the last address in the sector. If the address generated from the address counter 14 is not the last address in the sector ("NO" in step S56), the address generated from the address counter 14 is incremented by 1 (step S57), and processing on the next address is performed (steps S48 to S53). If verification of the written data does not pass in step S53 ("NO" in step S53), writing the data into the redundant sector and verifying the data are repeated until the count value of the counter reaches a predetermined value. When the count value of the counter reaches the predetermined value ("YES" in step S54), the PGM/ER state machine 20 outputs an error signal to the controller unit 100 (step S55). If the address generated from the address counter 14 matches the address recorded in the failure address register 13 ("YES" in step S48), it is determined whether the address generated from the address counter 14 is the last address in the error sector (step S56), and, if not, the address counter is incremented by 1 (step S57). Processing on the next address is then performed.

These procedures are repeated to move the data already stored in the sector with the error to the redundant sector. When the address counter 14 finishes generating all the addresses in the sector with the error and the data transfer from the error sector is completed ("YES" in step S56), the automatic redundancy state machine 21 writes the defective address recorded in the failure address register 13 into the redundant CAM 16 (step S58). The record of the automatic redundancy is then written into the additional CAM 17 (step S58), and the automatic redundancy routine ends. If there are two or more unused redundant sectors in step S25 shown in FIG. 8, the automatic redundancy routine may be repeated with the rest of the unused redundant sectors during the controlling procedure of step S46 or step S55. More specifically, feedback to step S27 is optimally performed.

In this manner, when programming fails, the data with which the programming fails and the data already written in the sector are written in the redundant sector in accordance with this first embodiment of the present invention, thereby advantageously preventing data loss and securing the data. Thus, system reliability can be increased. Also, a record of automatic redundancy is made in the additional CAM 17. Accordingly, whether automatic redundancy in accordance with the present invention has been performed on the customer system or whether redundancy has been performed at the time of vender shipment can be determined, thereby effectively performing defect analysis at the vendor side.

Second Embodiment

Figure 10:
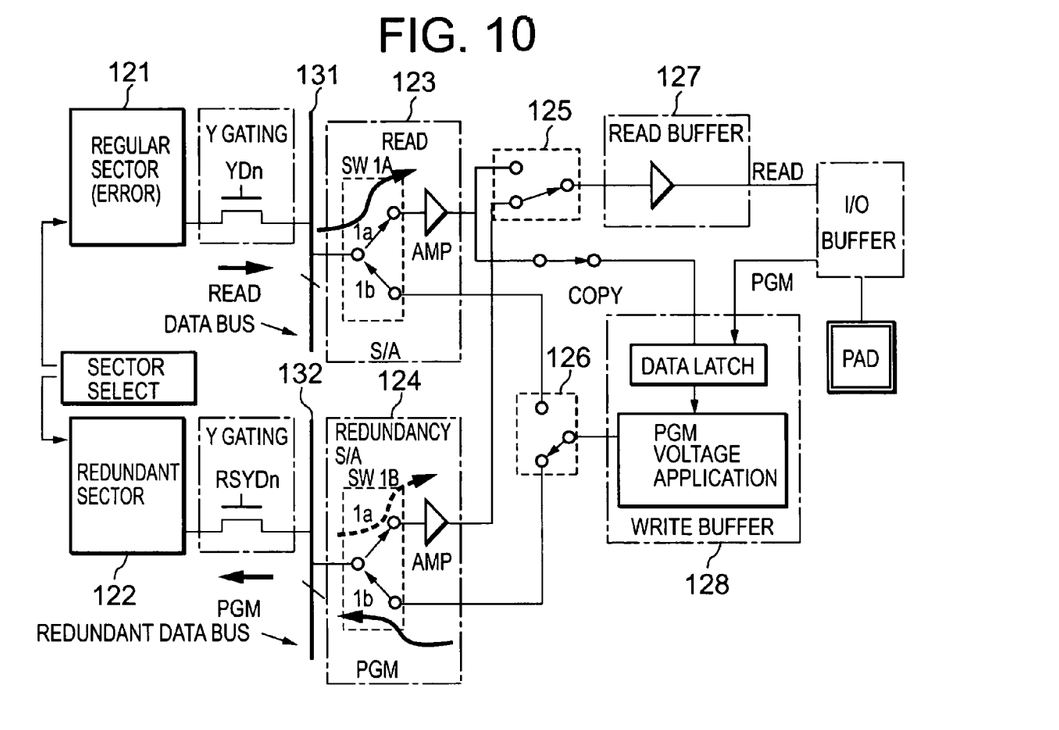
FIG. 10 illustrates the structure of a semiconductor device in accordance with a second embodiment of the present invention.

In accordance with a second embodiment of the present invention, a semiconductor device illustrated in FIG. 10 can be employed. The semiconductor device illustrated in FIG. 10 includes a regular sector 121 and a redundant sector 122 connected to separate data bus lines 131 and 132, respectively. Also, a read sense amplifier 123 and a redundancy sense amplifier 124 are provided independently of each other and coupleable to a read buffer 127 and a write buffer 128 by switches 125 and 126, respectively. With this structure, a redundant cell array unit can be provided at any location outside the array. Also, since the flow of data is unidirectional, the time required for operations such as switching can be shortened.

Third Embodiment

Figure 11A:
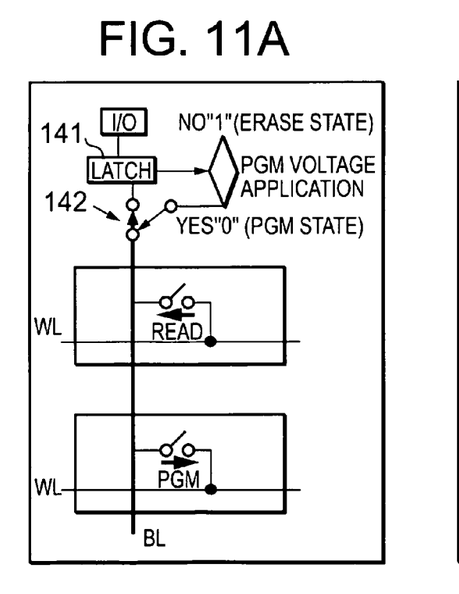
FIGS. 11A and 11B illustrate the structure of a semiconductor device in accordance with a third embodiment of the present invention.
Figure 11B:
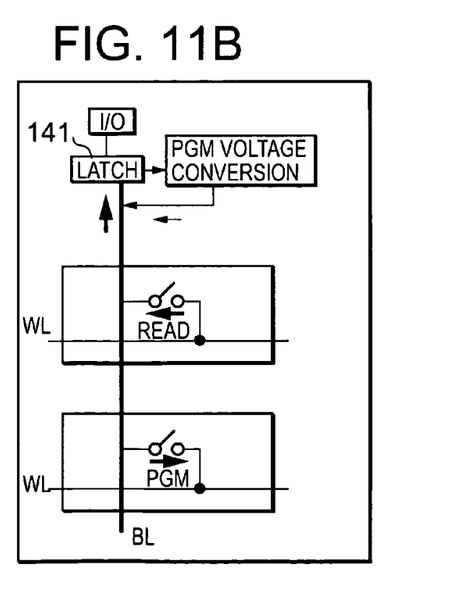

In accordance with the third embodiment for the present invention, as illustrated in FIGS. 11A and 11B, the data of the sector in which an error has occurred is stored in a latch circuit 141 connected to a bit line in a NAND-type flash memory. In FIG. 11A, a switch 142 is provided to switch the applied voltage between a programming voltage and an erasing voltage for the sector. In FIG. 11B, the latch circuit 141 is connected directly to a bit line, and a PGM voltage converter 143 that applies a voltage to the bit line adjusts the voltages to be applied.

The above described embodiments are preferred embodiments of the present invention. However, the present invention is not limited to these embodiments, and various changes may be made to them within the scope of the present invention. For example, a row address and a column address are compared with each other so as to determine the memory cell in which an error has occurred and write the data into the redundant sector in accordance with the above-described embodiments. However, rewriting into the redundant sector can alternatively be performed utilizing only a row address, as in word-line redundancy.

Further, the programming/erasing state machine 20 and the automatic redundancy state machine 21 may be integrated together into a sequence machine. In addition, the semiconductor device 1 may be formed as a discrete memory unit 10 or may be integrated with a MPU into a semiconductor. Also, in a non-volatile memory such as a FRAM or a MROM for which an erasing operation for each sector is not required, the step of checking whether the redundant sector has been initialized is not necessary.

In accordance with the present invention, initializing a predetermined sector in a redundant cell array region is not limited to making all the data 1/0 identical in the memory cell arrays in the sector. Other examples of initializing operations include stripe-type initialization and check-type initialization. In accordance with stripe-type initialization, the data of "1" and "0" are provided alternately at row addresses (in the word-line direction) or at column addresses (in the bit-line direction) in each of adjacent memory cells. More specifically, as shown in FIG. 10 of Japanese Unexamined Patent Publication No. 2004-079602 (Document 3), after erasing is performed on both used bits and unused bits in a Flash memory Oxide-Nitride-Oxide (ONO) structure, sometimes called a dual-bit memory cell structure, a series of initializing operations are performed until programming is performed only on the unused bits. As a result, initialization is performed to obtain the predetermined data in which the used bits (data "1") and the unused bits (data "0") erased by the bit line are adjacent to each other in a stripe fashion.

Thus, in accordance with an aspect of the present invention, there is provided a semiconductor device including a regular cell array region, a redundant cell array region that is provided in relation to the regular cell array region and a write control unit that controls reprogramming in which, when programming of a sector in the regular cell array region fails, data involved in the programming that fails and data already stored in the sector in the regular cell array region are written into the redundant cell array region. Since reprogramming is performed so as to write the data already written in the sector as well as the data involved in the programming that fails into the redundant cell array region, data loss can be prevented and data can be secured, thereby increasing the reliability of the system.

In a semiconductor device with the above-described structure, the write control unit initializes a given sector in the redundant cell array region so that certain data is written into the given sector prior to reprogramming. Since the predetermined sector in the redundant cell array region is initialized so as to write the predetermined data into the predetermined sector prior to reprogramming, double writing of data can be prevented. Also, the data already written in the sector in the regular cell array region in which programming fails and the data to be written can both be written into the predetermined sector in the redundant cell array region.

In a semiconductor device with the above-described structure, the write control unit does not perform initializing of a given sector when the given sector is already in an initialized state. Since an unnecessary operation such as an initializing operation is not performed when the predetermined sector is in an initialized state, the time required for reprogramming can be shortened.

A semiconductor device with the above-described structure may further includes a first memory part that stores information indicating whether each sector in the redundant cell array region is in use and a search control unit that searches the first memory part and detects a sector in the redundant cell array region that is not in use to select an unused sector in the redundant cell array region. Accordingly, overwriting of data over in used sectors can be prevented. Thus, loss of recorded data can be prevented increasing the reliability of the semiconductor device.

In a semiconductor device with the above-described structure, the first memory part may further include a first region that stores information indicating whether the sectors in the redundant cell array region are used and a second region that stores information indicating whether the sectors in the redundant cell array region are used as spare regions for aid in recovery from a program error. With this structure, redundancy can be prevented in a sector in which redundancy has already been performed by a vender or in a sector in which automatic redundancy has already been performed. Thus, reliability of the product can further be increased.

A semiconductor device with the above-described structure may further include a second memory part that stores information as to a relationship between a sector number of the sector in which programming thereof fails and a sector number of a given sector in the redundant cell array region involved in the reprogramming. With this information, the sector number of the sector in which programming fails in the regular cell array region can be associated with the sector number of the given sector in which the reprogramming is performed. Accordingly, at the time of data-read or erase, based on an address that is input from the outside, a proper sector in the redundant cell array can be selected and processing can be performed.

A semiconductor device with the above-described structure further includes a data storage unit that stores the data handled when programming fails. In this semiconductor device, the write control unit reads the data from the data storage unit and writes the read data into the redundant cell array region. Since the data involved in programming that fails is stored and then written into the redundant cell array region, data loss can be prevented and programming does not need to be restarted from the beginning, even if it fails.

A semiconductor device with the above-described structure may further include a failure address register that stores an address of a memory cell of the sector involved in the programming that fails. In accordance with this semiconductor device, the write control unit reads, from the sector involved in the programming that fails, data stored at an address other than the address stored in the failure address register, and writes the read data into the redundant cell array region through reprogramming. Since the address of the memory cell in the sector in which programming fails is stored, the data already written in the sector can be read and written into the redundant cell array region.

In a semiconductor device with the above-described structure, the write control unit may output an error signal to a controller that controls the semiconductor device when reprogramming of the redundant cell array region with the data involved in the programming that fails or the data already stored in the sector fails. Since an error signal is output to the controller when reprogramming fails, the controller can recognize failure of the reprogramming operation.

In a semiconductor device with the above-described structure, the search control unit may output an error signal to a controller that controls the semiconductor device when the sector in the redundant cell array region that is not in use is not detected. Since an error signal is output to the controller when an unused sector cannot be detected from the redundant cell array region, the controller can recognize that the semiconductor device is not in a reprogrammable state.

In a semiconductor device with the above-described structure, the write control unit may output an error signal to a controller in response to an inquiry about a state by polling from the controller. Since an error is reported in response to a polling signal that is output from the controller at predetermined intervals, there is very little delay in reporting an error to the controller.

In accordance with another aspect of the present invention, there is provided a program data redundancy method that includes the steps of programming a sector in a regular cell array region of a semiconductor device and performing reprogramming in which, when the programming of the sector in the regular cell array region fails, data involved in the programming that fails and data already stored in the sector in the regular cell array region are written into a redundant cell array region. Since in this manner reprogramming is performed so as to write data involved in the programming that fails and data already written in the sector into the redundant cell array region, data loss can be prevented and data can be secured. Thus, the reliability of a system utilizing this programming method in accordance with the present invention can be increased.

The above-described program data redundancy method may further include the step of initializing a given sector in the redundant cell array region so that given data is written into the given sector prior to reprogramming. Since the predetermined sector in the redundant cell array region is initialized so as to write the predetermined data into the predetermined sector prior to reprogramming, double writing of data can be prevented. Also, data already written in the sector in the regular cell array region in which programming fails and data to be written can both be written into the predetermined sector in the redundant cell array region.

In accordance with the program data redundancy method, initializing of the given sector prior to reprogramming may not be performed when the given sector is already in an initialized state. Since an unnecessary operation such as an initialing operation is not performed in the case where the predetermined sector is already in an initialized state, the time required for reprogramming can be shortened.

The above-described program data redundancy method may further include the step of storing data handled by programming that fails in a data storage unit. In accordance with the program data redundancy method, the step of reprogramming may include reading data from the data storage unit and writing the read data into the redundant cell array region. Since data involved in the programming that fails is once stored and is then written into the redundant cell array region, data loss can be prevented and programming does not need to be restarted from the beginning even if it fails.

The above-described program data redundancy method may further include the steps of storing, in a failure address register, an address of a memory cell in a sector involved in the programming that fails and comparing the address of the memory cell in the sector involved in the programming that fails with an address of each memory cell of the sector. Thus, in accordance with the program data redundancy method, the data already stored in the sector is written into the redundant cell array region by reprogramming on the basis of the comparison results. Since the address of the memory cell in the sector in which programming fails is stored, the data already written in the sector can be read and written into the redundant cell array region.

The above-described program data redundancy method may further include the step of outputting an error signal to a controller that controls the semiconductor device when reprogramming of the redundant cell array region with either data involved in the programming that fails or data already stored in the sector fails. Since an error signal is output to the controller when reprogramming fails, the controller can recognize the failure of the reprogramming.

The above-described program data redundancy method may further include the step of making a record of aid in recovery from a program error when reprogramming is successful. Thus, redundancy in a sector in which automatic redundancy has already been performed can be prevented and reliability of the product can be further increased.

As described above, a semiconductor device in accordance with the present invention can provides secure customer data with higher system reliability. Although a few preferred embodiments of the present invention have been shown and described, it would be appreciated by those skilled in the art that changes may be made in these embodiments without departing from the principles and spirit of the invention, the scope of which is defined in the claims below and their equivalents.

What is claimed is:

1. A semiconductor device comprising:
a regular cell array region comprising one or more sectors, each of the one or more sectors comprising a first plurality of memory cells;
a redundant cell array region comprising a second plurality of memory cells; and
a write control unit coupled to the regular cell array region and the redundant cell array region, wherein the write control unit controls programming of the one or more sectors of the regular cell array region and, when programming of one of the one or more sectors of the regular cell array region fails, both first data being data that is being programmed into the one of the one or more sectors when the programming thereof fails and second data being data that is already stored in the one of the one or more sectors of the regular cell array region are written into a portion of the second plurality of memory cells of the redundant cell array region.

2. The semiconductor device as claimed in claim 1, wherein the write control unit initializes a sector of the redundant cell array region and writes the second data into the sector of the redundant cell array region prior to the reprogramming.

3. The semiconductor device as claimed in claim 2, wherein the write control unit does not initialize the sector of the redundant cell array region when the sector of the redundant cell array region is already in an initialized state.

4. The semiconductor device as claimed in claim 1, further comprising:
a first memory part storing information indicating whether each sector of the redundant cell array region is in use; and
a search control unit coupled to the first memory part and searching the first memory part and detecting whether a sector of the redundant cell array region is in use or not in use, wherein the write control unit is coupled to the search control unit and writes the second data into a sector detected by the search control unit as not in use.

5. The semiconductor device as claimed in claim 4, wherein the first memory part comprises a first region storing information indicating whether each sector of the redundant cell array region are in use, and a second region storing information indicating whether each sector of the redundant cell array region are in use as spare regions for aid in recovery from a programming error.

6. The semiconductor device as claimed in claim 1, further comprising a second memory part storing information identifying a relationship between a sector number of the one of the one or more sectors of the regular cell array region for which the programming thereof failed and a sector number of a sector in the redundant cell array region wherein the first data and the second data are written.

7. The semiconductor device as claimed in claim 4, wherein the search control unit outputs an error signal to a controller coupled to and controlling the semiconductor device in response to the search control unit not detecting any sector in the redundant cell array region that is not in use.

8. The semiconductor device as claimed in claim 1, further comprising a data storage unit that stores the first data when programming the one of the one or more sectors of the regular cell array region, wherein the write control unit reads the first data from the data storage unit and writes the first data read therefrom into the redundant cell array region when the programming of the one of the one or more sectors of the regular cell array region fails.

9. The semiconductor device as claimed in claim 8, further comprising a failure address register that stores an address of a memory cell of the one of the one or more sectors of the regular cell array region involved in the programming that fails, wherein the second data read by the write control unit from the one of the one or more sectors of the regular cell array region involved in the programming that fails is data stored at addresses other than the address stored in the failure address register, the write control unit writing the second data into the portion of the second plurality of memory cells of the redundant cell array region.

10. The semiconductor device as claimed in claim 1, wherein the write control unit outputs an error signal to a controller coupled to and controlling the semiconductor device in response to failure of reprogramming of either the first data or the second data into the redundant cell array region.

11. The semiconductor device as claimed in claim 10, wherein the write control unit outputs an error signal to the controller in response to an inquiry from the controller polling a state of the redundant cell array region.

12. A data redundancy programming method using a processor, comprising the steps of:
programming a sector in a regular cell array region of a semiconductor device;
determining in the processor when programming of the sector in the regular cell array fails; and
reprogramming the sector in the regular cell array region when the processor determines that programming of the sector in the regular cell array region failed, the reprogramming comprising:
writing a, first data being data involved in the programming that failed and a second data being data already stored in the sector in the regular cell array region into a redundant cell array region.

13. The data redundancy programming method in accordance with claim 12, further comprising the steps of:
initializing a sector in the redundant cell array region; and
writing the second data from the sector in the regular cell array region into the sector in the redundant cell array region prior to performing the reprogramming.

14. The data redundancy programming method in accordance with claim 13, wherein the step of initializing the sector in the redundant cell array region prior to performing the reprogramming comprises the steps of:
determining whether the sector in the redundant cell array region is in an initialized state;
initializing the sector in the redundant cell array region when determining that the sector in the redundant cell array region is not in an initialized state; and
not performing initializing of the sector in the redundant cell array region when determining that the sector in the redundant cell array region is already in an initialized state.

15. The data redundancy programming method in accordance with claim 12, further comprising the step of storing the first data in a data storage unit when the processor determines the programming of the sector in the regular cell array region failed, wherein the step of reprogramming farther comprises:
  reading the first data from the data storage unit; and
  writing the first data read from the data storage unit into the redundant cell array region.

16. The data redundancy programming method in accordance with claim 15, wherein the step of reprogramming further comprises:
  writing data involved in the programming that failed into the redundant cell array region:
  storing, in a failure address register, an address of a memory cell in the sector of the regular cell array region that is involved in the programming that failed;
  comparing the address of the memory cell stored in the failure address register with an address of each memory cell of the sector of the regular cell array region; and
  writing the data already stored in the sector of the regular cell array region into the redundant cell array region in response to results of the comparing step.

17. The data redundancy programming method in accordance with claim 12, further comprising the step of outputting an error signal from the processor to a controller that controls the semiconductor device in response to reprogramming of the redundant cell array region with the first data or the second data fails.

18. The data redundancy programming method in accordance with claim 12, further comprising the step of generating a record of recovery in the processor from a program error in response to the reprogramming step being successful.

* * * * *